(12) United States Patent
Ogawa

(10) Patent No.: US 7,969,185 B2
(45) Date of Patent: Jun. 28, 2011

(54) LOGICAL CIRCUIT DEVICE, LOGICAL OPERATION VARYING METHOD, AND LOGICAL OPERATION SYSTEM

(75) Inventor: Toshio Ogawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 34 days.

(21) Appl. No.: 12/398,204

(22) Filed: Mar. 5, 2009

(65) Prior Publication Data

US 2009/0224799 A1    Sep. 10, 2009

(30) Foreign Application Priority Data

Mar. 6, 2008    (JP) .................................. 2008-056435

(51) Int. Cl.
*H03K 19/173*    (2006.01)

(52) U.S. Cl. .............. 326/38; 326/41; 326/47; 712/223; 712/225; 712/226; 712/234

(58) Field of Classification Search .............. 326/37–41, 326/47; 712/223, 225–226, 234
See application file for complete search history.

(56) References Cited

U.S. PATENT DOCUMENTS

| | | | |
|---|---|---|---|
| 7,065,665 B2 * | 6/2006 | Jacobson et al. .............. 713/400 |
| 7,200,235 B1 * | 4/2007 | Trimberger .................... 380/277 |
| 7,541,833 B1 * | 6/2009 | Neuendorffer et al. ......... 326/38 |
| 2003/0122578 A1 * | 7/2003 | Masui et al. .................... 326/39 |
| 2005/0125642 A1 | 6/2005 | Kimura |
| 2005/0248364 A1 * | 11/2005 | Vadi et al. ....................... 326/39 |
| 2007/0101107 A1 | 5/2007 | Isobe |
| 2007/0113015 A1 * | 5/2007 | Moll et al. ..................... 711/135 |
| 2007/0143577 A1 * | 6/2007 | Smith ............................. 712/10 |
| 2007/0162727 A1 | 7/2007 | Isobe |

FOREIGN PATENT DOCUMENTS

JP    2005-165961 A    6/2005
JP    2007-128124 A    5/2007

* cited by examiner

*Primary Examiner* — Jason M Crawford
(74) *Attorney, Agent, or Firm* — Fujitsu Patent Center

(57) ABSTRACT

A logical circuit device comprises a plurality of logical blocks including reconfigurable logical configurations and a network including reconfigurable connections among the plurality of logical blocks, wherein at least one of the plurality of logical blocks comprises a basic logical operation element. The basic logical operation element receives a first data signal and a first validity indication signal that becomes an asserted state when the first data signal is valid, outputs a second data signal generated by a first logical operation based on the first data signal and a second validity indication signal that becomes an asserted state when the second data signal is valid, and sets the second data signal to the asserted state in response to the asserted state of the first validity indication signal.

17 Claims, 11 Drawing Sheets

LOGICAL CIRCUIT DEVICE, LOGICAL OPERATION VARYING METHOD, AND LOGICAL OPERATION SYSTEM

CROSS-REFERENCE TO RELATED APPLICATIONS

This application claims the benefit of priority from Japanese Patent Application No. 2008-56435 filed on Mar. 6, 2008, the entire contents of which are incorporated herein by reference.

BACKGROUND OF THE INVENTION

1. Field of the Invention

This application relates to a logical circuit device.

2. Description of the Related Art

A logical circuit operating in sync with a clock signal includes combined logical circuits and flip-flops. The combined logical circuits execute logical operations in accordance with data loaded into flip-flops or an externally input data, and the results of the logical operations are loaded into the other flip-flops in sync with the clock signal. Data having been subjected to a logical operation in a certain cycle of the clock signal and loaded into the flip-flop is utilized as an input for a logical operation in the next cycle. Japanese Laid-open Patent Publication No. 2007-128124, Japanese Laid-open Patent Publication No. 2005-165961, etc. disclose techniques related to logical circuits.

SUMMARY

According to one aspect of an embodiment, a logical circuit device is provided. The logical device includes a plurality of logical blocks including reconfigurable logical configurations and a network including reconfigurable connections among the plurality of logical blocks. At least one of the plurality of logical blocks includes a basic logical operation element. The basic logical operation element receives a first data signal and a first validity indication signal that becomes an asserted state when the first data signal is valid, outputs a second data signal generated by a first logical operation based on the first data signal and a second validity indication signal that becomes an asserted state when the second data signal is valid, and sets the second data signal to the asserted state in response to the asserted state of the first validity indication signal. Additional advantages and novel features of the invention will be set forth in part in the description that follows, and in part will become more apparent to those skilled in the art upon examination of the following or upon learning by practice of the invention.

DESCRIPTION OF THE PREFERRED EMBODIMENTS

All of combined logical elements in a clock-synchronized device execute a single logical operation within 1 clock cycle. The combined logical elements execute significant operations during a very short time until operation results are output after all inputs to the combined logical elements have been established. After such a very short operation time, the combined logical elements continue to hold the operation results.

Also in a dynamic reconfigurable device in which logics are dynamically reconfigurable, the logics are changed only once within 1 clock cycle. Accordingly, reconfigurable basic operation elements in the dynamic reconfigurable device execute logical operations once within 1 clock cycle. After such a very short operation time, as in the combined logical elements, the basic operation elements continue to hold the operation results.

During a time other than the very short time in which operations are executed within 1 clock cycle, the combined logical elements and the basic operation elements consume leak power. There is a limitation in increasing a circuit integration degree. Because the circuit integration degree is not increased, the length of interconnecting portions may not be shortened. Therefore, dynamic power consumption in the interconnecting portions is increased. Also, a delay caused in the interconnecting portions impedes a high-speed operation. In the reconfigurable device, logics may not be assembled in a number larger than that of the reconfigurable basic operation elements.

Figure 1:
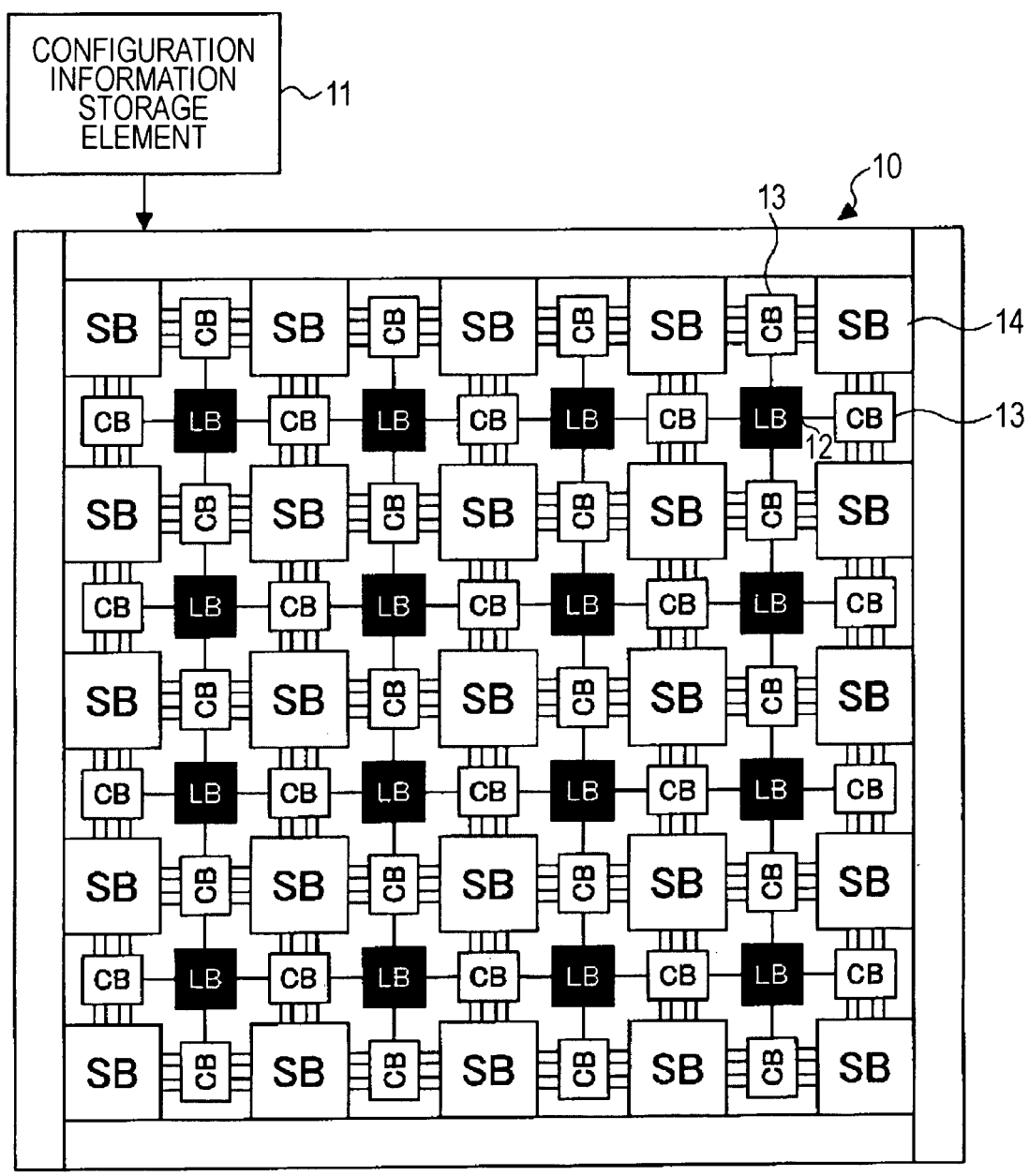
FIG. 1 illustrates a first embodiment.

FIG. 1 illustrates a first embodiment. A logical circuit device 10 is a logical circuit capable of dynamically reconfiguring its logical configuration of operations. The logical circuit device 10 may be, for example, a semiconductor integration chip. The dynamically reconfigurable logical circuit device 10 is coupled to a configuration information storage element 11. The configuration information storage element 11 is a memory, such as a RAM, for storing configuration information that specifies the logical configuration of the logical circuit device 10. With the configuration information being written in the configuration information storage element 11 for the logical circuit device 10, internal circuits of the logical circuit device 10 and coupling lines between the circuits are set to the logical configuration corresponding to the configuration information, and desired logical operations are executed. By successively rewriting data of the configuration information, different logical operations may be executed at different timings. While the configuration information storage element 11 is disposed outside the logical circuit device 10 in FIG. 1, the configuration information storage element 11 may be disposed inside the logical circuit device 10.

The logical circuit device 10 includes a logical block (LB) 12, a connection block (CB) 13, and a switch block (SB) 14. As shown in FIG. 1, a plurality of logical blocks 12 are arranged in row and column directions in a matrix pattern. Each logical block 12 is coupled to four connection blocks 13 arranged upward, downward, leftward, and rightward of the logical block 12. The switch block 14 is coupled between the connection blocks 13.

The logical configuration of each of the plurality of logical blocks 12 may be dynamically reconfigured. The connection blocks 13 and the switch blocks 14 constitute a network in which connections among the plurality of logical blocks 12 may be dynamically reconfigured. In accordance with the data of the configuration information of the configuration information storage element 11, the logical configuration of the logical blocks 12 is determined and respective line connection states of the connection blocks 13 and the switch blocks 14 are also determined. In other words, the substance of a logical operation executed by each logical block 12 is determined depending on the configuration information, and which output of one of the logical blocks 12 may be coupled to which input of which one of the logical blocks is also determined depending on the configuration information.

Figure 2:
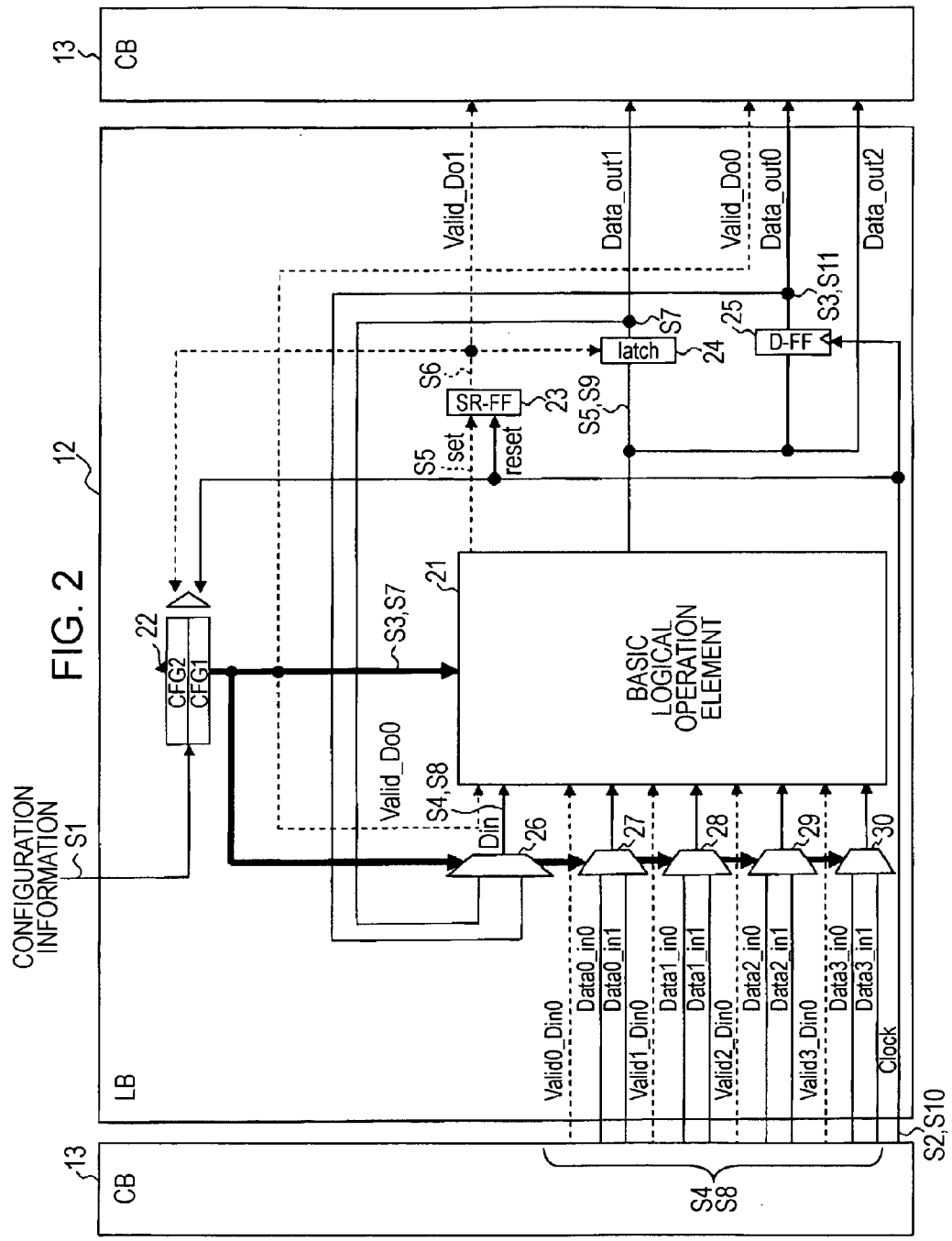
FIG. 2 illustrates a logical block according to the first embodiment.

FIG. 2 illustrates the logical block 12 according to the first embodiment. The logical block 12 includes a basic logical operation element 21, an LB logical configuration information storage element 22, a set/reset flip-flop (SR-FF) 23, a latch 24, a delay flip-flop (D-FF) 25, and selectors 26 to 30. The flip-flop 23 and the latch 24 may be storage elements that may hold an output value, and may be, for example, a dynamic storage element using a capacitance element. While one logical block 12 is coupled to two connection blocks 13 in FIG. 2, it may be coupled to four connection blocks 13 as shown in FIG. 1. The connection blocks 13 are interconnected through the switch block 14. Hence, which input or output of the logical block 12 is coupled to which one of the connection blocks 13 is not an essential matter.

The basic logical operation element 21 of the logical block 12 receives first data signals Data0_in0 to Data3_in0 and first validity indication signals Valid0_Din0 to Valid3_Din0 that are brought into the asserted state when the first data signals are valid. The basic logical operation element 21 outputs a second data signal Data_out1 that is generated by a first logical operation with the first data signals being inputs, and a second validity indication signal Valid_Do1 that is brought into the asserted state when the second data signal is valid. The basic logical operation element 21 sets the second data signal to the asserted state in response to the asserted state of the first validity indication signal.

In FIG. 2, a feed-back data signal Din is supplied to an input of the basic logical operation element 21. Accordingly, the first data signals may include the feed-back data signal Din in addition to Data0_in0 to Data3_in0. The first validity indication signals may include a validity indication signal Valid_Do0 for the feed-back data signal Din in addition to Valid0_Din0 to Valid3_Din0.

In the logical operation of the basic logical operation element 21, all of Data0_in0 to Data3_in0 and Din may not be used as input data. For example, only three inputs of Data0_in0 to Data2_in0 may be used as input data in the logical operation. In this case, when the validity indication signals Valid0_Din0 to Valid2_Din0 are all brought into the asserted state, it is determined that the inputs have been established. Then, the logical operation is executed and the validity indication signal Valid_Do1, which is output, is asserted.

The timing of executing the logical operation may not be controlled. For example, when the basic logical operation element 21 includes combined logical circuits having basic logical gates, such as AND and OR, the output data signal may be generated corresponding to the input data signal (or the output data signal may be generated at all times). However, when the validity indication signals on the input side are all brought into the asserted state, the validity indication signal, which is output, is asserted. The basic logical operation element 21 may include, for example, a lookup table. An output value of the lookup table is set in accordance with the configuration information loaded into the LB logical configuration information storage element 22.

All of the plurality of logical blocks 12, shown in FIG. 1, are not required to be the logical blocks shown in FIG. 2. For example, only one logical block may be the logical block 12 shown in FIG. 2, and other logical blocks may be logical blocks differing from the logical block 12 shown in FIG. 2. More specifically, the other logical block may be, for example, a logical block with a data-signal validity indication signal assigned to only the input side, or a logical block with a data-signal validity indication signal assigned to only the output side.

The flip-flop 23 holds the second validity indication signal Valid_Do1 that is output from the basic logical operation element 21. Assuming that the asserted state of the second validity indication signal Valid_Do1 is, for example, HIGH, the flip-flop 23 holds HIGH when the second validity indication signal Valid_Do1 becomes HIGH. The latch 24 holds the second data signal Data_out1, which is output from the basic logical operation element 21, in response to the asserted state of the second validity indication signal Valid_Do1. For example, when the second validity indication signal Valid_Do1 becomes HIGH, the latch 24 latches and holds the second data signal Data_out1.

The flip-flop 25 is a storage element that executes a latch operation in sync with an externally supplied clock signal Clock. The clock signal Clock is supplied in common to the plurality of logical blocks 12 shown in FIG. 1. The basic logical operation element 21 receives third data signals Data0_in1 to Data3_in1 and executes a second logical operation with the third data signals being inputs. When the basic logical operation element 21 outputs a fourth data signal Data_out0 (=Data_out2) that is generated by the second logical operation, the flip-flop 25 holds the fourth data signal Data_out0 in sync with the clock signal Clock. The flip-flop 23 and the latch 24 are asynchronous with the clock.

The logical block 12 includes a feedback signal path for selectively supplying an output of the latch 24 and an output of the flip-flop 25 to the basic logical operation element 21. A selector 26 selects either the output of the latch 24 or the output of the flip-flop 25. The feedback signal path feeds back output data of the basic logical operation element 21 as input data thereof. Thus, the logical block 12 operates as a sequence logical circuit independently.

The LB logical configuration information storage element 22 stores the configuration information supplied from the configuration information storage element 11 shown in FIG. 1. The LB logical configuration information storage element 22, shown in FIG. 2, stores (first) configuration information (data) CFG1 specifying a logical configuration that executes the first logical operation, and (second) configuration information (data) CFG2 specifying a logical configuration that executes the second logical operation. When the configuration information CFG1 is loaded into the basic logical operation element 21 from the LB logical configuration information storage element 22, the basic logical operation element 21 executes the first logical operation. When the configuration information CFG2 is loaded into the basic logical operation element 21 from the LB logical configuration information storage element 22, the basic logical operation element 21 executes the second logical operation. In response to the asserted state of the second validity indication signal "Valid_Do1", the basic logical operation element 21 is changed from the logical configuration for executing the first logical operation to the logical configuration for executing the second logical operation. Also, the configuration information CFG2 from the LB logical configuration information storage element 22 is written in response to the asserted state of the second validity indication signal Valid_Do1.

Figure 3:
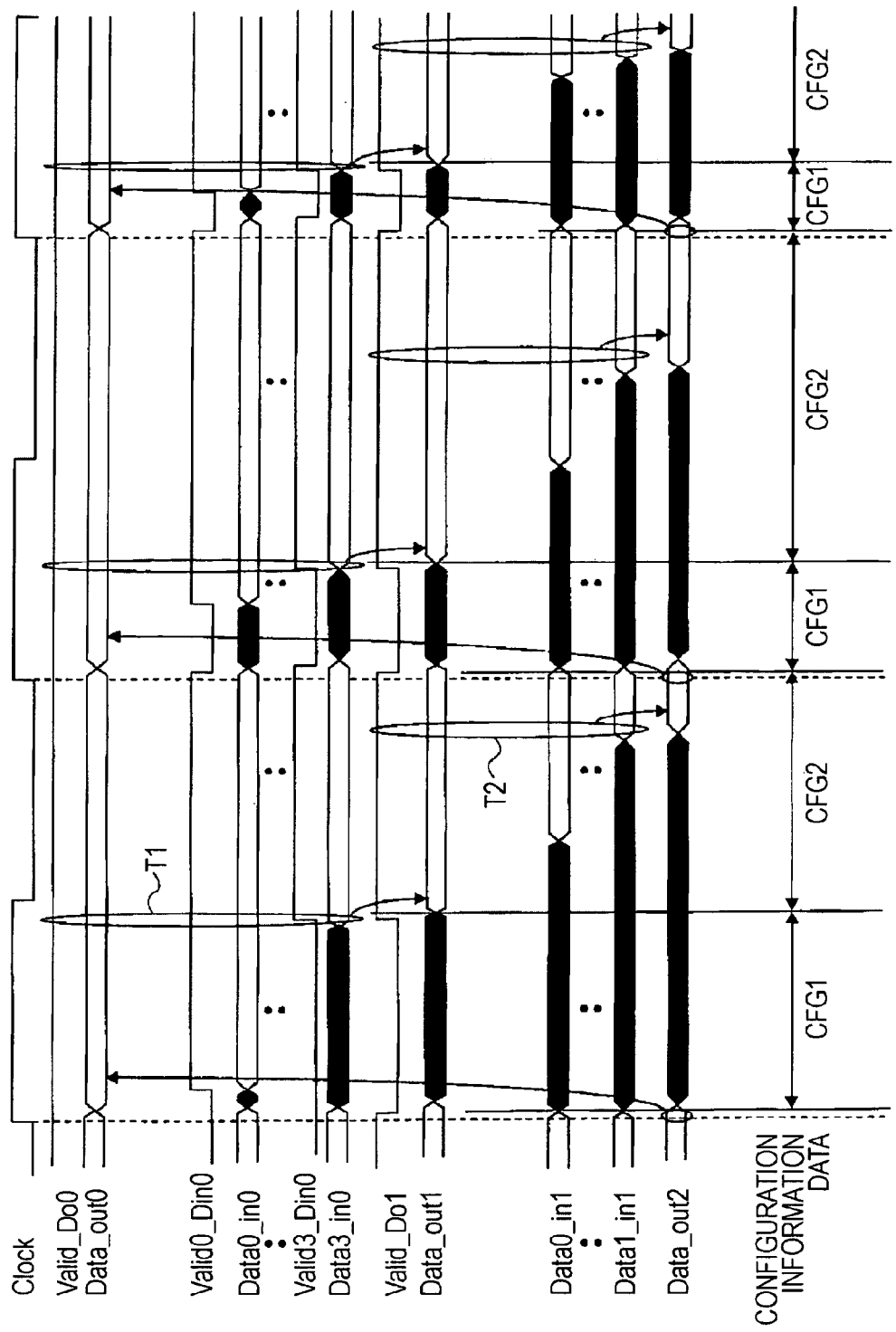
FIG. 3 illustrates operations of the logical block according to the first embodiment.

FIG. 3 illustrates operations of the logical block 12 according to the first embodiment.

From the configuration information storage element 11 shown in FIG. 1, the configuration information CFG1 and the configuration information CFG2 are loaded into the LB logical configuration information storage element 22 shown in FIG. 2 (S1). The configuration information storage element 11 may further store other configuration information. The loading of the configuration information into the LB logical configuration information storage element 22 may be executed at the time of initializing a chip of the logical circuit device 10. When the logical configuration is to be changed between one clock cycle and another clock cycle during the operation of the logical circuit device 10, the configuration information may be loaded, as required, into the LB logical configuration information storage element 22. When the logical configuration is fixed, the LB logical configuration information storage element 22 includes a ROM or a 0/1 clip and the loading operation of the configuration information is omitted.

The clock signal Clock is supplied to the LB logical configuration information storage element 22 (S2), and the configuration information CFG1 is loaded into the basic logical operation element 21 in response to a clock pulse (S3). Based on the loaded configuration information CFG1, the basic logical operation element 21 is set to the logical configuration that executes the logical operation corresponding to the configuration information CFG1. Also, based on the configuration information, it is determined whether or not the data signal Data_out0, which is outputted from the flip-flop 25, is valid. The validity indication signal Valid_Do0 is generated depending on the determination result. The LB logical configuration information storage element 22 includes a control circuit. The control circuit may generate the validity indication signal Valid_Do0.

Supplied to the basic logical operation element 21 are the data signals Data0_in0 to Data3_in0 of which validity or invalidity is indicated respectively by the validity indication signals Valid0_Din0 to Valid3_Din0 (S4). The selector 26 selects the data signal Data_out0 that is the output of the flip-flop 25. Selectors 27 to 30 select the data signals Data0_in0 to Data3_in0, respectively, without selecting the data signals Data0_in1 to Data3_in1. Similar to the validity indication signal Valid_Do0, the control circuit in the LB logical configuration information storage element 22 may generate a selection instruction signal for each selector.

The logical operation executed by the basic logical operation element 21 may use a part of the input data signals. For simplicity of the explanation, the following description is made on the assumption that the input data signals are all used.

As shown in FIG. 3, when the validity indication signals on the input side become the asserted state (i.e., the state indicating validity), the basic logical operation element 21 generates the output data signal Data_out1 and sets the validity indication signal Valid_Do1, which indicates that the generated output data signal is valid, to the asserted state (i.e., the state indicating validity) (S5). As shown at the left end of FIG. 3, the logical configuration of the basic logical operation element 21 is set based on the configuration information CFG1 at the start of a first cycle of the clock signal Clock.

When the validity indication signals Valid0_Din0 to Valid3_Din0 on the input side become the asserted state (HIGH state in the illustrated example) at timing T1, the validity indication signal Valid_Do1 indicating that the output data signal is valid is brought into the asserted state (HIGH state in the illustrated example), and the output data signal Data_out1 is generated (established).

The validity indication signal Valid_Do1 in the asserted state shown in FIG. 2 functions as a set signal for the flip-flop 23. The flip-flop 23 is brought into the set state in accordance with the validity indication signal Valid_Do1 in the asserted state, and the output of the flip-flop 23 takes a signal level corresponding to the asserted state of Valid_Do1 (S6). Thus, the flip-flop 23 outputs the validity indication signal Valid_Do1 in the asserted state.

The validity indication signal Valid_Do1 in the asserted state, which is output from the flip-flop 23, is used as a trigger signal for a latch operation of the latch 24. The latch 24, shown in FIG. 2, performs a Low-Through operation. When the validity indication signal Valid_Do1 becomes HIGH, the latch 24 latches the output data signal Data_out1 (S7).

The validity indication signal Valid_Do1 in the asserted state, which is output from the flip-flop 23, functions as a trigger signal for an operation of loading the second configuration information CFG2 into the basic logical operation element 21 from the LB logical configuration information storage element 22. In accordance with the validity indication signal Valid_Do1 in the asserted state, the second configuration information CFG2 is loaded into the basic logical operation element 21 (S7). In FIG. 3, after the validity indication signal Valid_Do1 has becomes the asserted state at the timing T1, the configuration information is changed from CFG1 to CFG2.

The output data signal Data_out1 output from the latch 24 is output to the connection block 13 shown in FIG. 2, and it is also used as input data for the next logical operation inside the logical block 12, as required. The output data signal Data_out1 output from the latch 24 becomes valid when the validity indication signal Valid_Do1 is in the asserted state.

Thereafter, the data signals Data0_in1 to Data3_in1 are supplied to the basic logical operation element 21 (S8). The selector 26, shown in FIG. 2, selects the data signal Data_out1 that is the output of the latch 24. Selectors 27 to 30, shown in FIG. 2, select the data signals Data0_in1 to Data3_in1, respectively, instead of selecting the data signals Data0_in0 to Data3_in0.

In the basic logical operation element 21, the second configuration information CFG2 is loaded until a next pulse of the clock signal Clock arrives. Upon the arrival of the next clock signal pulse, the first configuration information CFG1 is loaded into the basic logical operation element 21. In sync with the clock signal pulse, the flip-flop 25, shown in FIG. 2, latches the output signal of the basic logical operation element 21. Such a synchronous operation performed at the fixed timing does not require signals indicating validity/invalidity of the input data signals Data0_in1 to Data3_in1. Accordingly, the input data signals Data0_in1 to Data3_in1 do not have corresponding validity indication signals. However, the corresponding validity indication signals may be provided for the input data signals Data0_in1 to Data3_in1. The validity indication signal Valid_Do0 on the output side is generated depending on the validity indication signals on the input side similar to the validity indication signal Valid_Do1.

With the input data signals Data0_in1 to Data3_in1 and the feed-back input data signal Din (=Data_out1) being input, the basic logical operation element 21 executes the logical operation corresponding to the configuration information CFG2 and generates the output data signal Data_out2 (S9). The output data signal Data_out2 is output to the connection block 13 without being synchronized with the clock signal Clock. When a pulse of the clock signal Clock is supplied (S10), the output data signal Data_out2 is loaded into the flip-flop 25 in sync with the pulse. The flip-flop 25 outputs the loaded data as the output data signal Data_out0 (S11).

The output data signal Data_out2, which is output to the connection block 13 without being synchronized with the clock signal Clock, may be used as any of Data0_in1 to Data3_in1 in another logical block 12. Therefore, the output data signal Data_out2 is not associated with the corresponding validity indication signal.

In the second half of the first cycle of the clock signal Clock, as shown in FIG. 3, the logical configuration of the basic logical operation element 21 is set based on the configuration information CFG2. When the input data signals are all established at timing T2, the output data signal Data_out2 is generated (established). When a second pulse of the clock signal Clock arrives, the output data signal Data_out2 is latched, as the output data signal Data_out0, by the flip-flop 25, and the configuration information is rewritten from CFG2 to CFG1.

Figure 4:
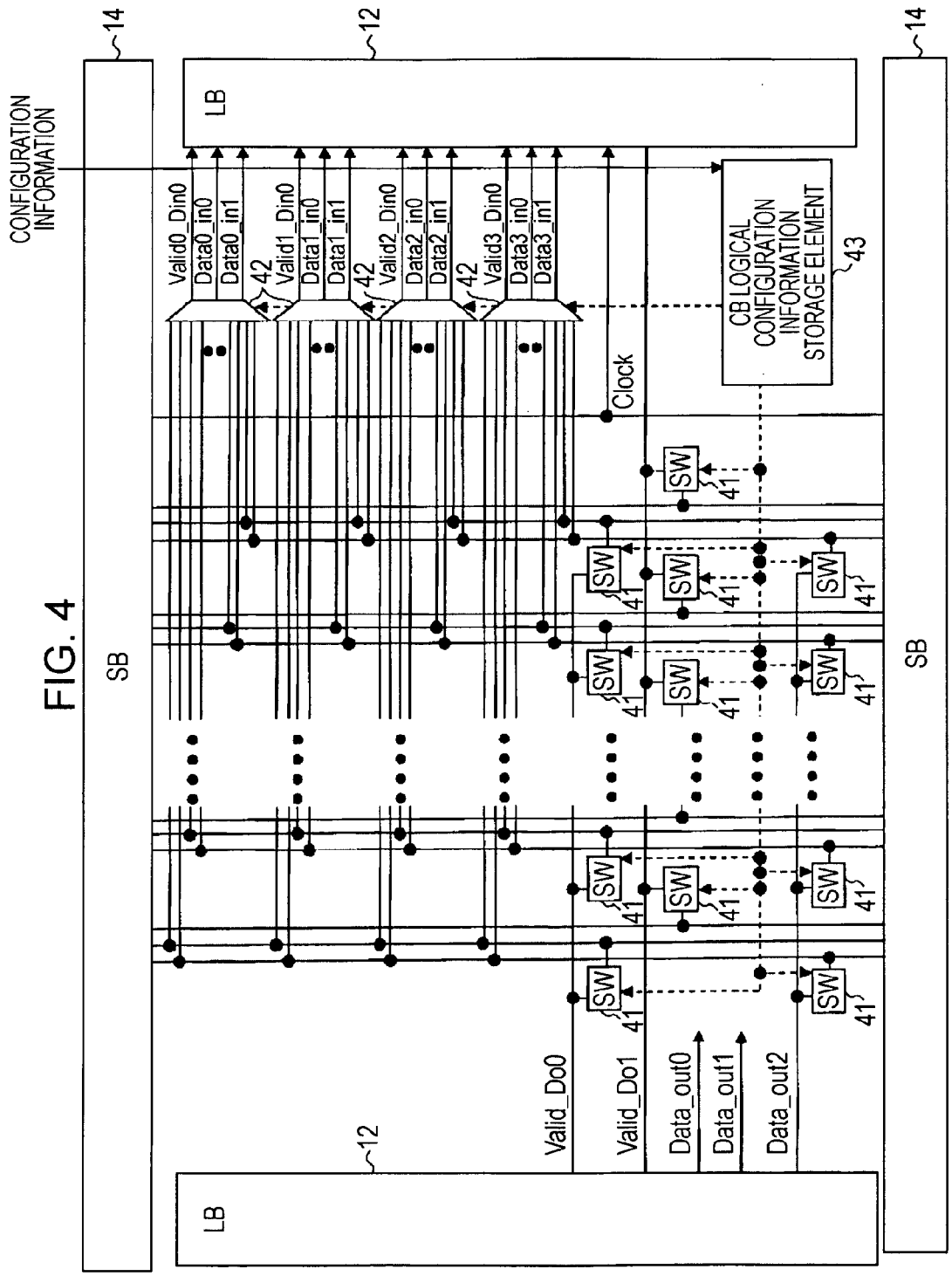
FIG. 4 illustrates a connection block according to the first embodiment.

FIG. 4 illustrates the connection block 13 according to the first embodiment. The connection block 13 includes a plurality of switches 41, a plurality of selectors 42, and a CB logical configuration information storage element 43. The switches 41 control connections between vertical signal lines interconnecting the switch blocks 14 and horizontal signal lines through which the output signals of the logical block 12 propagate. One switch 41 is disposed at an intersect between one vertical signal line and one horizontal signal line to connect or disconnect both the signal lines depending on the configuration information loaded into the CB logical configuration information storage element 43. In the first embodiment, the horizontal signal lines include a signal line for the output data signal Data_out0 of the logical block 12, a signal line for the validity indication signal Valid_Do0 thereof, a signal line for the output data signal Data_out1 thereof, a signal line for the validity indication signal Valid_Do1 thereof, and a signal line for the output data signal Data_out2 thereof.

The selector (multiplexer) 42 selects, from among the signals propagating through the vertical signal lines, desired signals based on the configuration information loaded into the CB logical configuration information storage element 43 and supplies the selected signals, as the input data signal and the validity indication signal, to the logical block 12. The input data signal and the validity indication signal, which are contemporaneously selected by one selector 42 and input to the logical block 12, are the output data signal and the validity indication signal that are generated in the other logical block 12. For example, the input data signal Data2_in0 and the validity indication signal Valid2_Din0, which are input to the logical block 12 on the right side as viewed in FIG. 4, are the output data signal Data_out1 and the validity indication signal Valid_Do1, which are output from the logical block 12 on the left side as viewed in FIG. 4. The input data signals Data0_in1 to Data3_in1 input to the logical block 12 may be input as the input data signals alone to the logical block 12 in spite of the corresponding validity indication signals.

In FIG. 4, the configuration information stored in the CB logical configuration information storage element 43 is loaded from the configuration information storage element 11 shown in FIG. 1. The operation of loading the configuration information into the CB logical configuration information storage element 43 may be executed at the time of initializing the chip of the logical circuit device 10. When the logical configuration is to be changed between one clock cycle and another clock cycle during the operation of the logical circuit device 10, the configuration information is loaded, as required, into the CB logical configuration information storage element 43. When the logical configuration is fixed, the CB logical configuration information storage element 43 may include a ROM or a 0/1 clip and the loading operation of the configuration information may be omitted. The configuration information stored in the CB logical configuration information storage element 43 may be kept fixed during at least 1 clock cycle.

Figure 5:
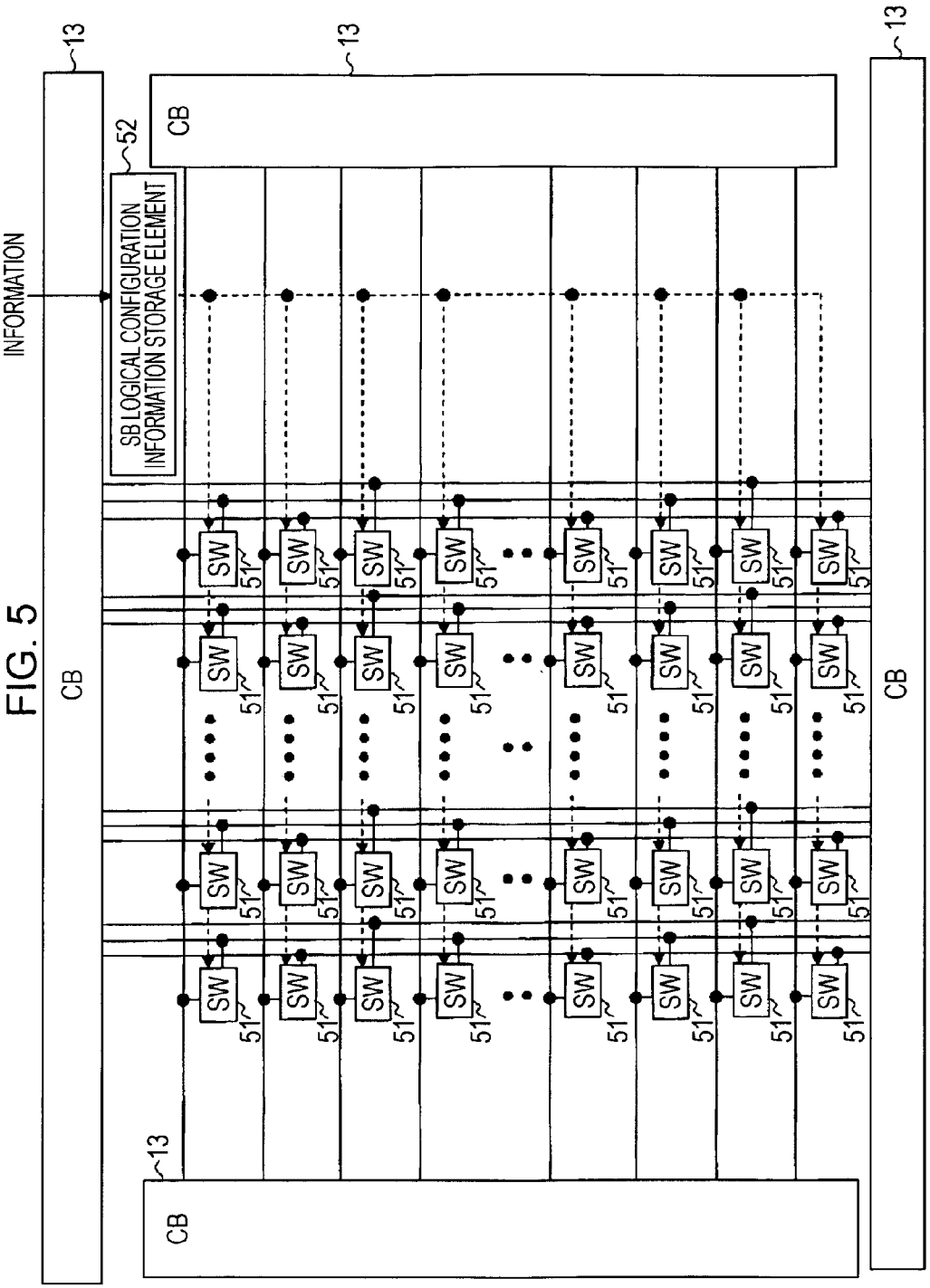
FIG. 5 illustrates a switch block according to the first embodiment.

FIG. 5 illustrates the switch block 14 in the first embodiment. The switch block 14 includes a plurality of switches 51 and an SB logical configuration information storage element 52. The switches 51 control connections between vertical signal lines interconnecting the connection blocks 13 which are vertically arranged on the same column and horizontal signal lines interconnecting the connection blocks 13 which are horizontally arranged on the same row. One switch 51 is disposed at an intersect between one vertical signal line and one horizontal signal line to connect or disconnect both the signal lines depending on the configuration information loaded into the SB logical configuration information storage element 52. As in the connection block 13 shown in FIG. 4, the switch block 14 is controlled such that the input data signal and the validity indication signal, which are input to one logical block 12, are the data signal and the validity indication signal which are output from the other logical block 12.

The configuration information stored in the SB logical configuration information storage element 52, shown in FIG. 5, is loaded from the configuration information storage element 11 shown in FIG. 1. The operation of loading the configuration information into the SB logical configuration information storage element 52 may be executed at the time of initializing the chip of the logical circuit device 10. When the logical configuration is to be changed between one clock cycle and another clock cycle during the operation of the logical circuit device 10, the configuration information is loaded, as required, into the SB logical configuration information storage element 52. When the logical configuration is fixed, the SB logical configuration information storage element 52 includes a ROM or a 0/1 clip and the loading operation of the configuration information may be omitted. The configuration information stored in the SB logical configuration information storage element 52 may be kept fixed during at least 1 clock cycle.

In the logical circuit device 10 of the first embodiment, the logical configuration of each logical block 12 may be changed within one clock cycle in an asynchronous timing. The validity indication signal enables determining whether a certain logical operation is completed. In the first embodiment, after a certain logical operation is completed, the next configuration information data may be loaded immediately to prepare for a new logical operation.

In the first embodiment, logics may be realized with a smaller number of logical elements. Also, in the first embodiment, since the logical operation may be executed a plurality of times within one cycle, a ratio of a leak current to a dynamic current for the logical operation may be reduced. Further, since an average interconnection length is shortened, dynamic power may be reduced. In an FPGA (Field Programmable Gate Array), logical elements, such as LUTs (Look-Up Tables), occupy an area of about 20% and interconnecting portions between the logical elements occupy an area of about 80%. With the first embodiment, the area of the interconnecting portions may be reduced and the area efficiency may be increased. In addition, the shorter average interconnection length is effective in reducing a propagation delay and in realizing high-speed operations of a reconfigurable device.

In some cases, configuration data of an operation element exceeds the capacity of a configuration data storage section within the operation element, or interconnection information exceeds the capacity of a storage section within an interconnection control element. Even in such a case, a limitation on logical quantity, which is attributable to a physical area of silicon, may be eliminated by dividing the logical configuration of the configuration data into pieces within one clock cycle. Also, when the number of combined logics is so large that a function may not be accommodated in a given circuit region, the desired combined logics may be realized by executing the function in a manner divided into plural pieces within one clock cycle.

Figure 6:
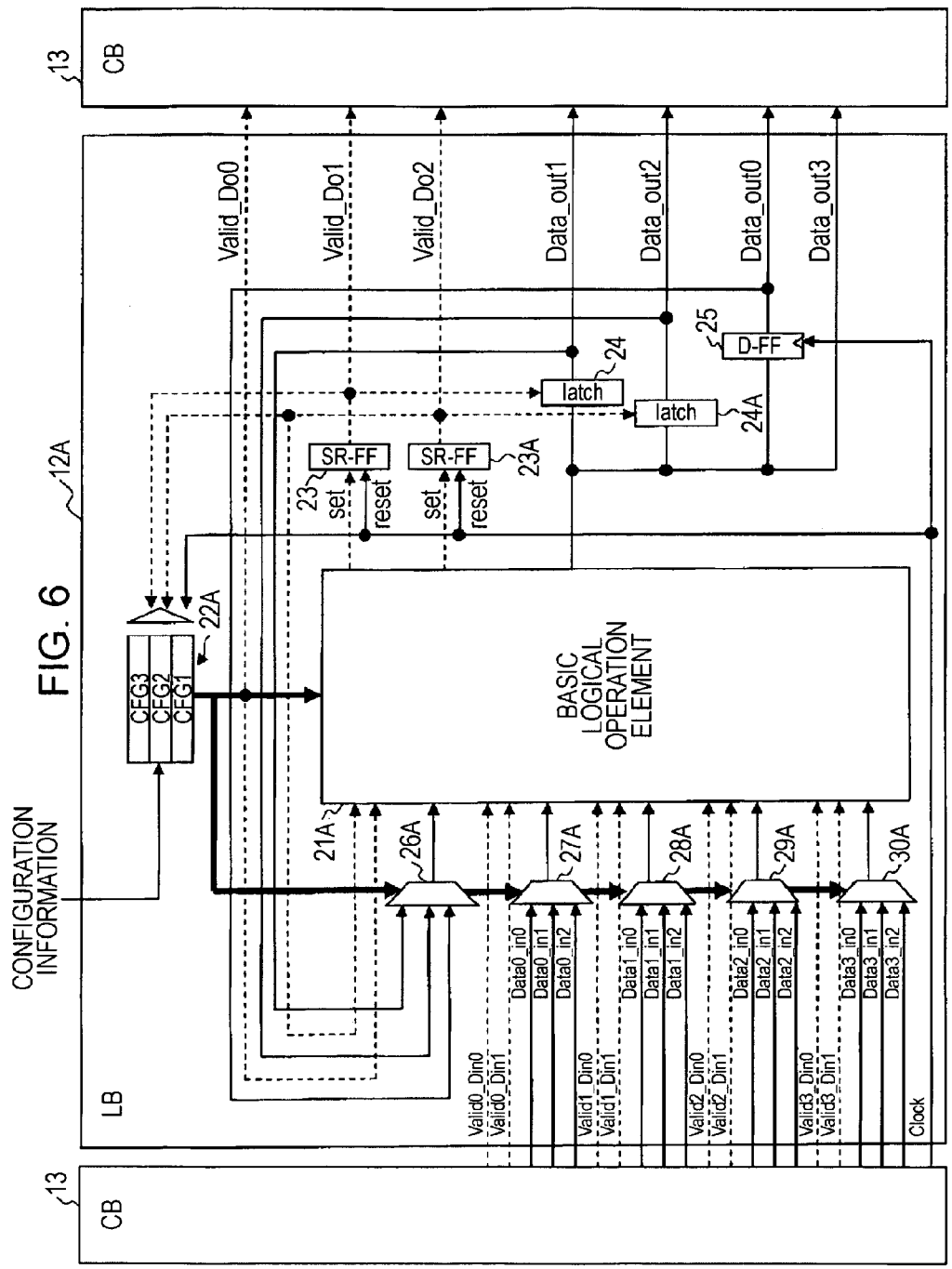
FIG. 6 illustrates another exemplary logical block according to the first embodiment.

FIG. 6 illustrates another example of the logical block according to the first embodiment. A logical block 12A, shown in FIG. 6, includes a basic logical operation element 21A, an LB logical configuration information storage element 22A, a set/reset flip-flop (SR-FF) 23, a latch 24, a set/reset flip-flop (SR-FF) 23A, a latch 24A, a delay flip-flop (D-FF) 25, and selectors 26A to 30A. Note that the same components as those in the logical block 12, shown in FIG. 2, are denoted by the same numerals and a description of those components is omitted here.

The logical block 12A, shown in FIG. 6, realizes three different logical configurations within one clock cycle. The logical block 12A receives two sets of data inputs associated with validity indication signals and holds two sets of data outputs associated with validity indication signals. Input data signals Data0_in0 to Data3_in0 and validity indication signals Valid0_Din0 to Valid3_Din0 are externally input data used for a first logical operation corresponding to first configuration information CFG1. An output data signal of the first logical operation is Data_out1, and a corresponding validity indication signal is Valid_Do1. Input data signals Data0_in1 to Data3_in1 and validity indication signals Valid0_Din1 to Valid3_Din1 are externally input data used for a second logical operation corresponding to second configuration information CFG2. An output data signal of the second logical operation is Data_out2, and a corresponding validity indication signal is Valid_Do2. Input data signals Data0_in2 to Data3_in2 are externally input data used for a third logical operation corresponding to third configuration information CFG3. An output data signal of the third logical operation is denoted by Data_out3 and Data_out0, and a validity indication signal corresponding to Data_out0 is Valid_Do0. In comparison with the operation of the logical block 12 shown in FIG. 2, the operation of the logical block 12A, shown in FIG. 6, differs in the number of times the logical configuration is changed within one clock cycle, and the other configuration is the same.

The logical block 12A, shown in FIG. 6, executes asynchronous change of the configuration information twice in accordance with the validity indication signals. The logical block may also execute asynchronous change of the configuration information three or more times.

Figure 7:
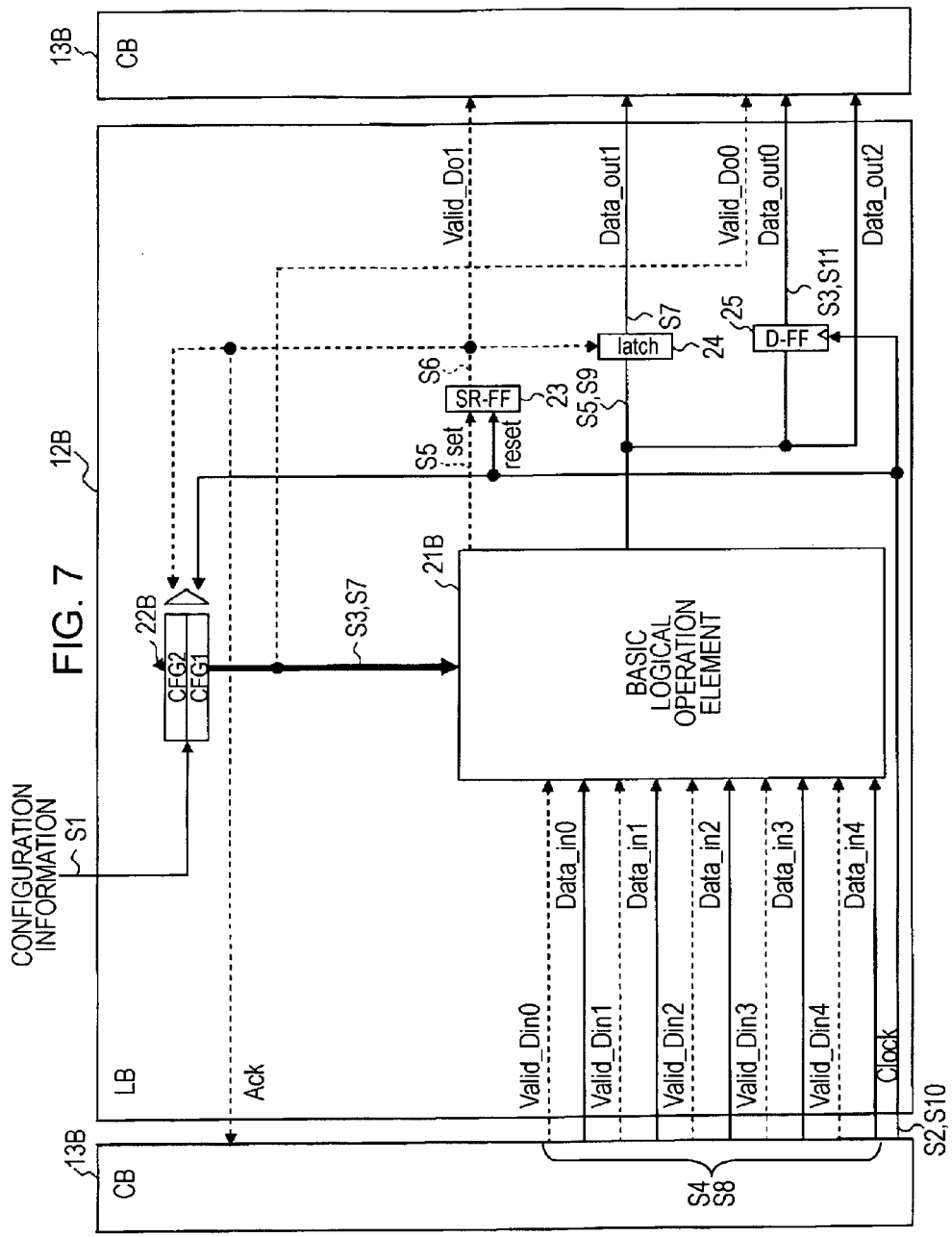
FIG. 7 illustrates a second embodiment.

FIG. 7 illustrates a second embodiment. In the second embodiment, the logical block 12 of the logical circuit device 10, shown in FIG. 1, is replaced with a logical block 12B. Further, the connection block 13 of the logical circuit device 10 is replaced with a connection block 13B. A switch block 14 in the second embodiment is the same as the switch block 14 in the first embodiment and has the configuration shown in FIG. 5.

The logical block 12B, shown in FIG. 7, includes a basic logical operation element 21B, an LB logical configuration information storage element 22B, a set/reset flip-flop (SR-FF) 23, a latch 24, and a delay flip-flop (D-FF) 25. Note that, in the logical block 12B shown in FIG. 7, the same components as those in the logical block 12, shown in FIG. 2, are denoted by the same numerals and a description of those components is omitted here.

The basic logical operation element 21B of the logical block 12B receives first data signals Data_in0 to Data_in4 and first validity indication signals Valid_Din0 to Valid_Din4 that are brought into the asserted state when the first data signals are valid. The basic logical operation element 21B outputs a second data signal Data_out1 that is generated by the first logical operation based on the first data signals, and a second validity indication signal Valid_Do1 that is brought into the asserted state when the second data signal is valid. The basic logical operation element 21B sets the second data signal to the asserted state in response to the asserted state of the first validity indication signal.

The logical block 12B, shown in FIG. 7, has no path for feeding back the output data signal to an input of the basic logical operation element 21B. However, the output data signal output from the logical block 12B may be returned to the input of the logical block 12B through the connection block and the switch block. In other words, a feedback path may be provided by using a network portion that includes the connection block and the switch block.

The logical block 12B, shown in FIG. 7, has no selectors on the input side of the basic logical operation element 21B. Selectors disposed in the connection block and coupled to the input side of the logical block 12B may provide the selection.

In the logical block 12B in the second embodiment, a circuit scale is reduced by deleting the feedback path and the selectors. Alternatively, the feedback path and the selectors may be added to the logical block 12B in the second embodiment as in the first embodiment.

In the logical operation of the basic logical operation element 21B, all of Data_in0 to Data_in4 may not be used as input data. For example, only three inputs of Data_in0 to Data_in2 may be used as input data in the logical operation of the basic logical operation element 21B. When the validity indication signals Valid_Din0 to Valid_Din2 are all brought into the asserted state, the basic logical operation element 21B determines that the inputs have been established. Thereafter, the logical operation is executed and the validity indication signal Valid_Do1, which is output, is asserted.

The timing of executing the logical operation may not be controlled. For example, when the basic logical operation element 21B is constituted by combined logical circuits having basic logical gates, such as AND and OR, the output data signal may be generated corresponding to the input data signal (or generated at all times). However, when the validity indication signals on the input side are all brought into the asserted state, the validity indication signal, which is output, is asserted. The basic logical operation element 21B may include, for example, a lookup table. An output value of the lookup table is set in accordance with the configuration information data loaded into the LB logical configuration information storage element 22B.

The LB logical configuration information storage element 22B operates in the same manner as the LB logical configuration information storage element 22 (FIG. 2) in the first embodiment. Because the logical block 12B has no feedback path, there is no need of generating selection signals supplied to the selectors.

The logical block 12B supplies the validity indication signal Valid_Do1 output from the flip-flop 23, as an acknowledge signal Ack, to the connection block 13B which is coupled to the input side of the logical block 12B. When the logical operation based on the first configuration information CFG1 is completed and the output data signal Data_out1 is established, the logical block 12B returns the acknowledge signal Ack indicating the completion of the logical operation to the input side. In response to the completion of the logical operation, the logical block 12B brings the acknowledge signal Ack into the asserted state.

Figure 8:
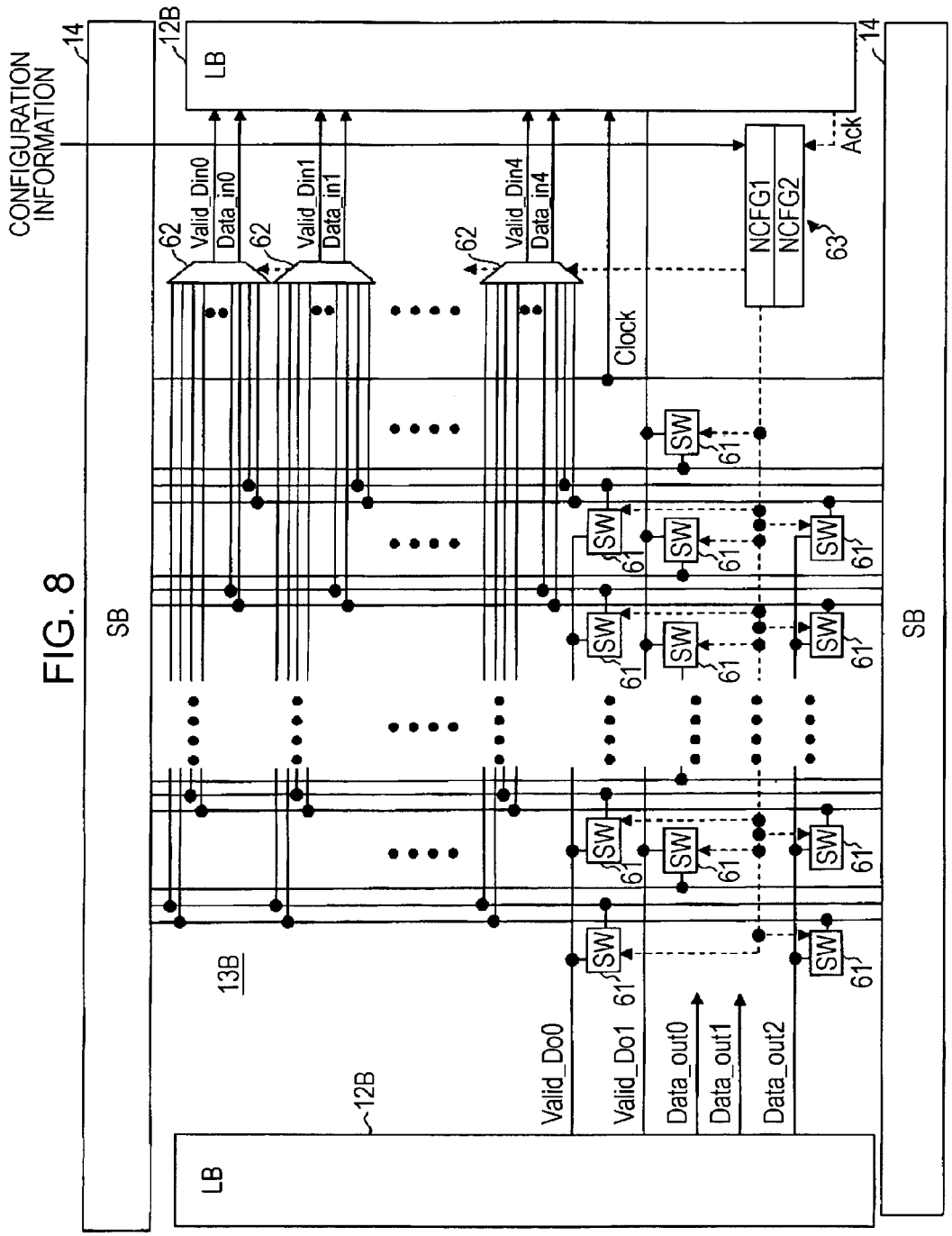
FIG. 8 illustrates a connection block according to the second embodiment.

FIG. 8 illustrates the connection block 13B in the second embodiment. The connection block 13B includes a plurality of switches 61, a plurality of selectors 62, and a CB logical configuration information storage element 63. The switches 61 control connections between vertical signal lines interconnecting the switch blocks 14 and horizontal signal lines through which the output signals of the logical block 12B propagate. One switch 61 is disposed at an intersect between one vertical signal line and one horizontal signal line to connect or disconnect both the signal lines depending on the configuration information loaded into the CB logical configuration information storage element 63. In the second embodiment, the horizontal signal lines include a signal line for the output data signal Data_out0 of the logical block 12B, a signal line for the validity indication signal Valid_Do0 thereof, a signal line for the output data signal Data_out1 thereof, a signal line for the validity indication signal Valid_Do1 thereof, and a signal line for the output data signal Data_out2 thereof.

The selector (multiplexer) 62 selects, from among the signals propagating through the vertical signal lines, desired signals based on data of the configuration information loaded into the CB logical configuration information storage element 63 and supplies the selected signals, as the input data signal and the validity indication signal, to the logical block 12B. The input data signal and the validity indication signal, which are contemporaneously selected by one selector 62 and input to the logical block 12B, are the output data signal and the validity indication signal which are generated in other logical block 12B. For example, the input data signal Data_in0 and the validity indication signal Valid_Din0, which are input to the logical block 12B on the right side as viewed in FIG. 8, are the output data signal Data_out1 and the validity indication signal Valid_Do1, which are output from the logical block 12B on the left side as viewed in FIG. 8.

The configuration information stored in the CB logical configuration information storage element 63, shown in FIG. 8, is loaded from the configuration information storage element 11 shown in FIG. 1. The configuration information contains first configuration information (data) NCFG1 and second configuration information (data) NCFG2. The operation of loading the configuration information into the CB logical configuration information storage element 63 may be executed at the time of initializing the chip of the logical circuit device 10. When the logical configuration is to be changed between one clock cycle and another clock cycle during the operation of the logical circuit device 10, the configuration information may be loaded, as required, into the CB logical configuration information storage element 63. When the logical configuration is fixed, the CB logical configuration information storage element 63 may have a ROM or a 0/1 clip and the loading operation of the configuration information may be omitted.

The acknowledge signal Ack generated by the logical block 12B is supplied to the CB logical configuration information storage element 63. In the first half of a certain clock cycle, the CB logical configuration information storage element 63 supplies control signals based on the first configuration information NCFG1 to the switches 61 and the selectors 62. With the supply of the control signals, line connection (interconnection) is performed based on the first configuration information NCFG1. In response to the asserted state of the acknowledge signal Ack, the CB logical configuration information storage element 63 changes a control mode from the control based on the first configuration information NCFG1 to the control based on the second configuration information NCFG2. When the acknowledge signal Ack is asserted, the control signals supplied to the switches 61 and the selectors 62 are changed from control signals corresponding to the first configuration information NCFG1 to control signals corresponding to the second configuration information NCFG2. As a result, in the second half of the clock cycle, the control signals corresponding to the second configuration information NCFG2 are supplied to the switches 61 and the selectors 62.

Figure 9:
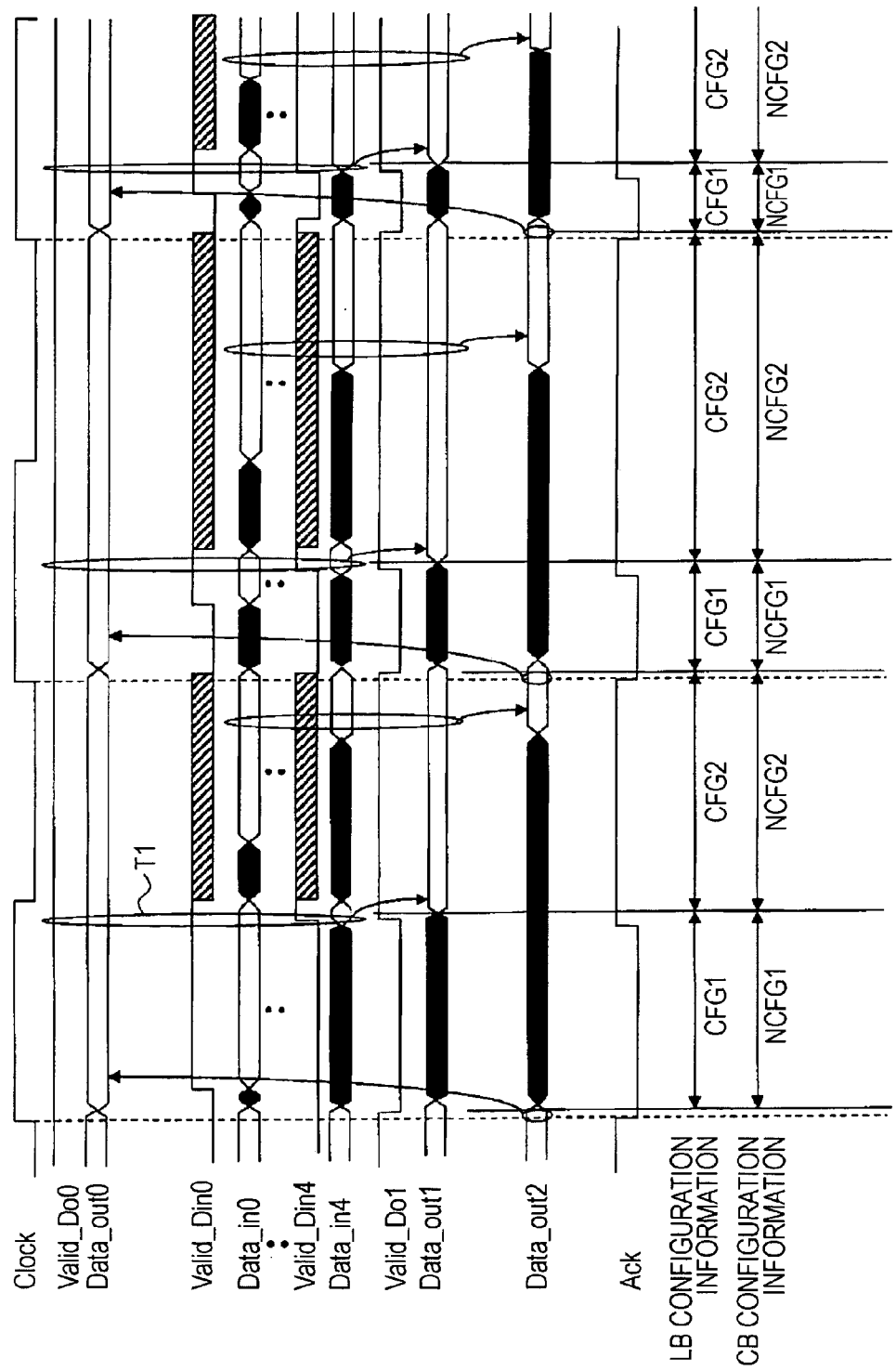
FIG. 9 illustrates operations of the logical block according to the second embodiment.

FIG. 9 illustrates operations of the logical block 12B corresponding to the second embodiment.

From the configuration information storage element 11 shown in FIG. 1, the configuration information CFG1 and the configuration information CFG2 are loaded into the LB logical configuration information storage element 22B shown in FIG. 7 (S1). A pulse of the clock signal Clock is supplied to the LB logical configuration information storage element 22B (S2). In response to the clock pulse, the configuration information CFG1 is loaded into the basic logical operation element 21B (S3). The basic logical operation element 21B is thereby set to the logical configuration that executes the logical operation corresponding to the configuration information CFG1. Based on the configuration information, it is determined whether or not the data signal Data_out0, which is the output of the flip-flop 25, is valid. The validity indication signal Valid_Do0 is generated depending on the determination result. The LB logical configuration information storage element 22B includes a control circuit. The control circuit may generate the validity indication signal Valid_Do0.

Supplied to the basic logical operation element 21B are the data signals Data_in0 to Data_in4 of which validity or invalidity is indicated respectively by the validity indication signals Valid_Din0 to Valid_Din4 (S4). The logical operation executed by the basic logical operation element 21B may use only a part of the input data signals. For simplicity of the explanation, the following description is made on the assumption that the input data signals are all used.

When the validity indication signals on the input side become the asserted state (i.e., the state indicating validity), the basic logical operation element 21B generates the output data signal Data_out1 and sets the validity indication signal Valid_Do1, which indicates that the generated output data signal is valid, to the asserted state (i.e., the state indicating validity) (S5).

As shown at the left end of FIG. 9, the logical configuration of the basic logical operation element 21B, shown in FIG. 7, is set based on the configuration information CFG1 at the start of a first cycle of the clock signal Clock. The CB logical configuration information storage element 63, shown in FIG. 8, makes the configuration information NCFG1 valid and generates the corresponding control signals. When the validity indication signals Valid_Din0 to Valid_Din4 on the input side become the asserted state (HIGH state in the illustrated example) at timing T1, the validity indication signal Valid_Do1 indicating that the output data signal is valid is brought into the asserted state (HIGH state in the illustrated example), and the output data signal Data_out1 is generated (established).

In FIG. 7, the validity indication signal Valid_Do1 in the asserted state functions as a set signal for the flip-flop 23. The flip-flop 23 is set, and the output Valid_Do1 of the flip-flop 23 becomes the asserted state (S6). Thus, the flip-flop 23 holds the validity indication signal Valid_Do1 in the asserted state.

The validity indication signal Valid_Do1 in the asserted state, which is output from the flip-flop 23, is used as a trigger signal for a latch operation of the latch 24. The latch 24 is a latch that performs a Low-Through operation. When the validity indication signal Valid_Do1 becomes HIGH, the latch 24 latches the output data signal Data_out1 (S7).

The validity indication signal Valid_Do1 in the asserted state, which is output from the flip-flop 23, functions as a trigger signal for an operation of loading the second configuration information CFG2 into the basic logical operation element 21B from the LB logical configuration information storage element 22B. The second configuration information CFG2 is loaded into the basic logical operation element 21B (S7). In FIG. 9, after the validity indication signal "Valid_Do1" has become the asserted state at the timing T1, the configuration information is changed from CFG1 to CFG2. The acknowledge signal Ack is brought into the asserted state (HIGH state in the illustrated example). In response to the asserted state of the acknowledge signal Ack, the CB logical configuration information storage element 63 changes the configuration information NCFG1 for generating the control signals to the configuration information NCFG2. Thus, the line connection of the connection block 13B is changed correspondingly.

The output data signal Data_out1 output from the latch 24, shown in FIG. 7, is output to the connection block 13B. The output data signal Data_out1 output from the latch 24 becomes valid when the validity indication signal Valid_Do1 is in the asserted state.

With the input data signals Data_in0 to Data_in4 being input (S8), the basic logical operation element 21B executes the logical operation corresponding to the configuration information CFG2 and generates the output data signal Data_out2 (S9). The output data signal Data_out2 is output to the connection block 13B without being synchronized with the clock signal Clock. When a pulse of the clock signal Clock is supplied (S10), the output data signal Data_out2 is loaded into the flip-flop 25 in sync with the pulse. The flip-flop 25 outputs the loaded data as the output data signal Data_out0 (S11).

In the second half of the first cycle of the clock signal Clock, as shown in FIG. 9, the logical configuration of the basic logical operation element 21B is set based on the configuration information CFG2. When the input data signals are all established at timing T2, the output data signal Data_out2 is generated (established). When a second pulse of the clock signal Clock arrives, the output data signal Data_out2 is latched, as the output data signal Data_out0, by the flip-flop 25, and the configuration information is rewritten from CFG2 to CFG1.

Figure 10:
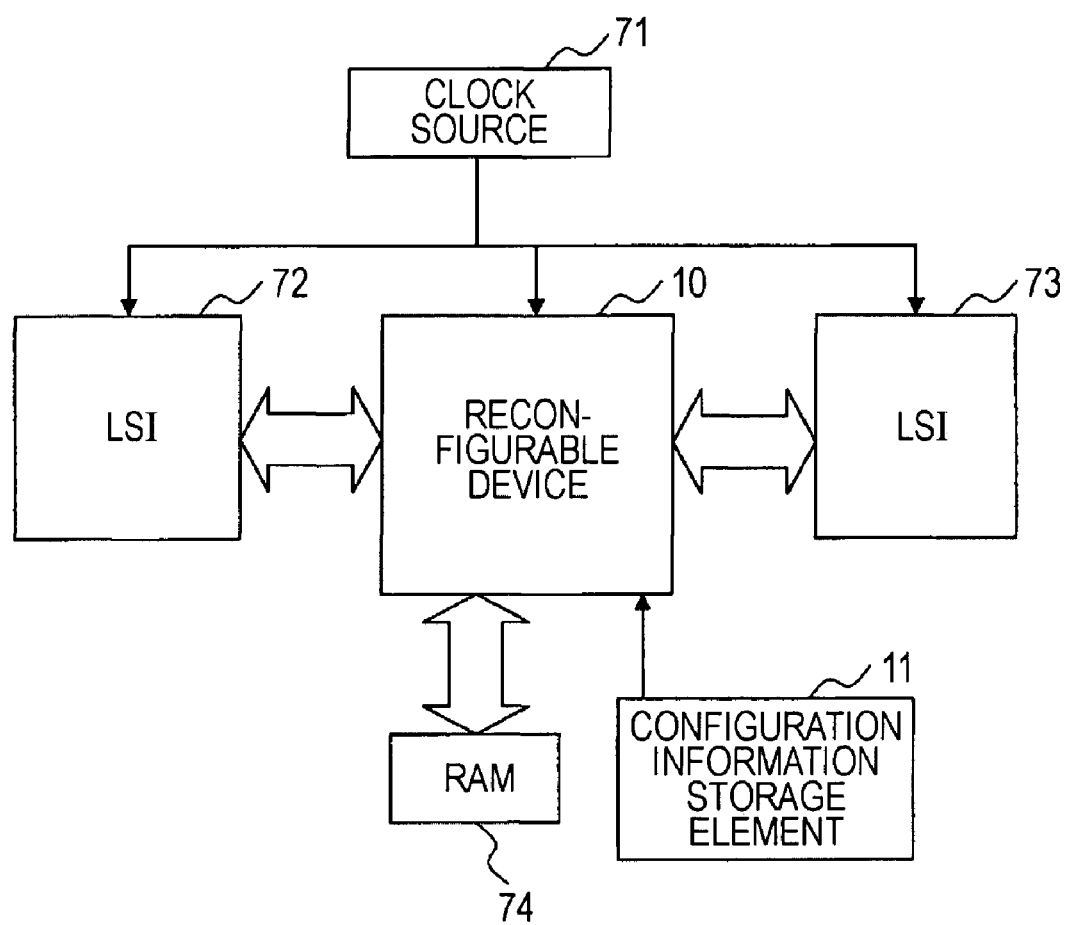
FIG. 10 illustrates a third embodiment.

FIG. 10 illustrates a third embodiment. The third embodiment represents one example of a system using the logical circuit device 10. The system shown in FIG. 10 includes the logical circuit device 10 including a reconfigurable device, a configuration information storage element 11, a clock source 71, an LSI 72, an LSI 73, and a RAM 74. A clock signal generated by the clock source 71 is supplied to the reconfigurable device 10, the LSI 72, and the LSI 73. The RAM 74 is coupled to the reconfigurable device 10. By using the clock signal in common, communications among the reconfigurable device 10 and the LSIs 72 and 73 are performed efficiently. The configuration information storage element 11 may include a ROM (Read Only Memory), a flash memory, etc.

Figure 11:
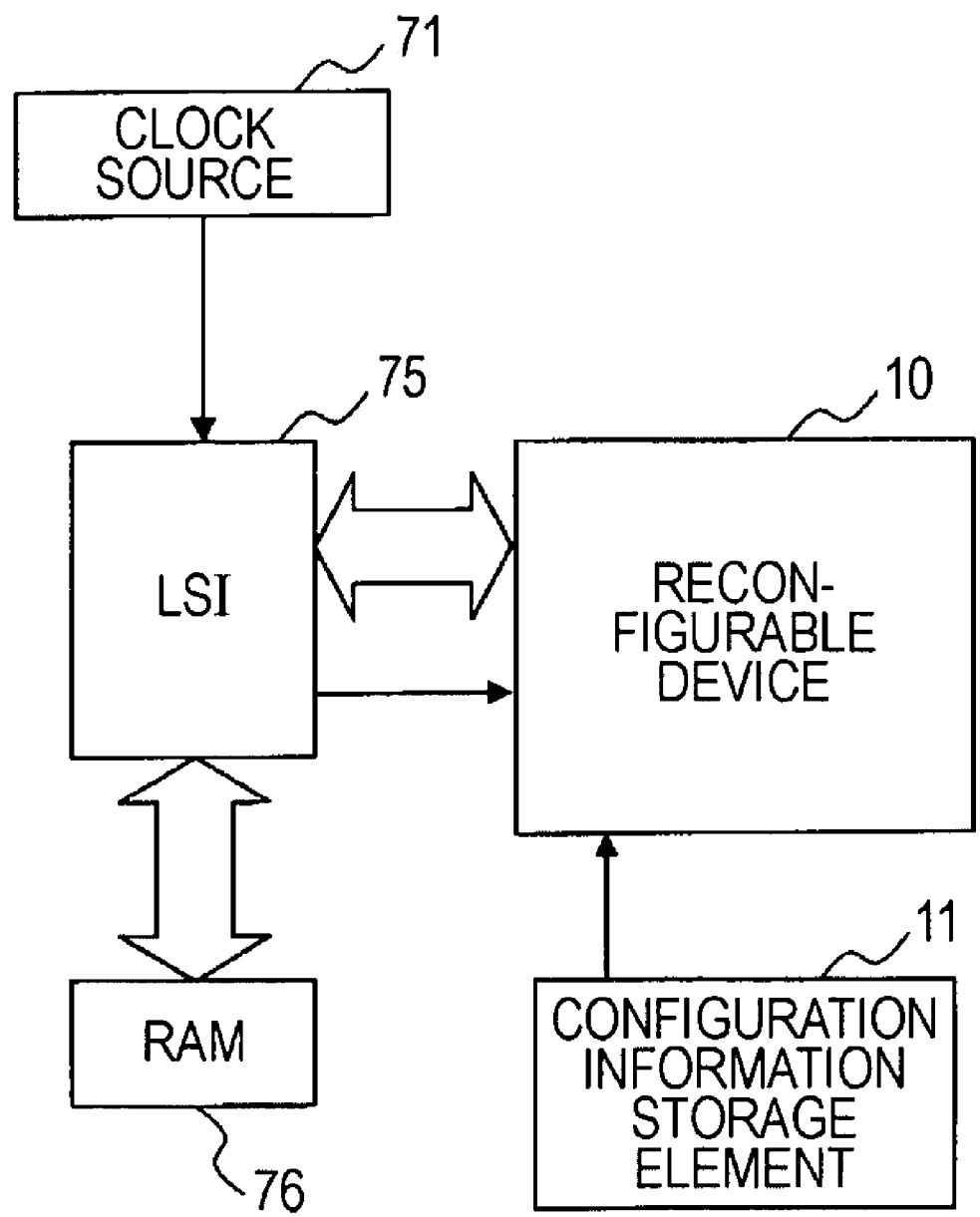
FIG. 11 illustrates a fourth embodiment.

FIG. 11 illustrates a fourth embodiment. The fourth embodiment represents another example of the system using the logical circuit device 10. The system shown in FIG. 11 includes the logical circuit device 10 including a reconfigurable device, a configuration information storage element 11, a clock source 71, an LSI 75, and a RAM 76. A clock signal generated by the clock source 71 is supplied to the LSI 75. The LSI 75 has a PLL (Phase Locked Loop) circuit and a frequency divider, which are operated in accordance with the clock signal. The PLL circuit and the frequency divider generate a high frequency clock signal or a low frequency clock signal. The LSI 75 supplies the high frequency clock signal or the low frequency clock signal to the reconfigurable device 10. The RAM 76 is coupled to the LSI 75.

Example embodiments of the present invention have now been described in accordance with the above advantages. It will be appreciated that these examples are merely illustrative of the invention. Many variations and modifications will be apparent to those skilled in the art.

What is claimed is:

1. A logical circuit device comprising:
   a plurality of logical blocks including reconfigurable logical configurations; and
   a network including reconfigurable connections among the plurality of logical blocks,
   wherein at least one of the plurality of logical blocks comprises a basic logical operation element, a first storage element, and a second storage element,
   wherein the basic logical operation element receives a first data signal and a first validity indication signal that becomes an asserted state when the first data signal is valid, outputs a second data signal generated by a first logical operation based on the first data signal and a second validity indication signal that becomes an asserted state when the second data signal is valid, and sets the second data signal to the asserted state in response to the asserted state of the first validity indication signal,
   wherein the first storage element holds the second validity indication signal in response to the asserted state of the second validity indication signal, and
   wherein the second storage element holds the second data signal in response to the asserted state of the second validity indication signal.

2. The logical circuit device according to claim 1, wherein the basic logical operation element includes a first logical configuration and a second logical configuration; and wherein the first logical configuration is changed to the second logical configuration in response to the asserted state of the second validity indication signal.

3. The logical circuit device according to claim 2, wherein the at least one logical block comprises:
   a fourth storage element that stores at least configuration information which defines the logical configuration for executing the first logical operation and configuration information which defines the logical configuration for executing the second logical operation.

4. The logical circuit device according to claim 3, wherein, in response to the asserted state of the second validity indication signal, the fourth storage element selectively supplies the configuration information corresponding to the first logical operation and the configuration information corresponding to the second logical operation to the basic logical operation element.

5. The logical circuit device according to claim 3, wherein one of the first data signal corresponding to the first logical operation and the first data signal corresponding to the second logical operation is selected in accordance with a signal supplied from the fourth storage element and is supplied to the basic logical operation element.

6. The logical circuit device according to claim 1, wherein the at least one logical block further comprises:
   a third storage element that operates in sync with a clock signal,
   wherein the basic logical operation element is changed from a logical configuration for executing the first logical operation to a logical configuration for executing a second logical operation in response to the asserted state of the second validity indication signal, and executes the second logical operation based on a third data signal to generate a fourth data signal, and
   wherein the third storage element holds the fourth data signal in sync with the clock signal.

7. The logical circuit device according to claim 1, wherein the first storage element and the second storage element perform asynchronous operations not in sync with a clock signal.

8. The logical circuit device according to claim 1, wherein the at least one logical block further comprises:
   a third storage element that holds a fourth data signal in sync with a clock signal, the fourth data signal generated by a second logical operation based on a third data signal when the basic logical operation element is changed from a first logical configuration for executing the first logical operation to a second logical configuration for executing the second logical operation in response to the asserted state of the second validity indication signal; and
   a signal path that selectively supplies an output of the second storage element and an output of the third storage element to an input of the basic logical operation element.

9. The logical circuit device according to claim 1, wherein the network comprises:
   a connection changing circuit disposed on the input side of the at least one logical block, wherein a connected state of the connection changing circuit is changed in response to the asserted state of the second validity indication signal.

10. The logical circuit device according to claim 9, further comprising: a signal line that supplies a common clock signal to the plurality of logical blocks, wherein the changing operation performed in response to the asserted state of the second validity indication signal is an asynchronous operation not in sync with the common clock signal.

11. A logical operation varying method for changing a logical operation in a plurality of logical blocks, the method comprising:
   supplying information corresponding to a first logical operation in accordance with a clock signal;
   receiving a first data signal and a first validity indication signal that becomes an asserted state when the first data signal is valid, and executing the first logical operation based on the first data signal;
   outputting a second data signal generated by the first logical operation and a second validity indication signal that becomes an asserted state when the second data signal is valid;
   holding the second validity indication signal in response to the asserted state of the second validity indication signal;
   holding the second data signal in response to the asserted state of the second validity indication signal;
   supplying information corresponding to a second logical operation in accordance with the asserted state of the second validity indication signal which has been held;
   receiving a third data signal and a third validity indication signal that becomes an asserted state when the third data signal is valid, and executing the second logical operation based on the third data signal; and
   outputting a fourth data signal generated by the second logical operation.

12. The logical operation varying method according to claim 11, wherein one of the second data signal and the fourth data signal is fed back.

13. The logical operation varying method according to claim 11, wherein the third data signal is supplied to a network interconnecting the plurality of logical blocks without being synchronized with the clock signal.

14. The logical operation varying method according to claim 11, wherein operations from receiving the information corresponding to the first logical operation to outputting the third data signal are performed within one cycle.

15. A logical operation system including:
   a clock generation circuit that generates a clock signal;
   a storage element that stores logical operation information; and
   a logical circuit device that operates in accordance with the clock signal, wherein the logical circuit device includes:
      a plurality of logical blocks that includes reconfigurable logical configurations; and
      a network that includes reconfigurable connections among the plurality of logical blocks,
      wherein at least one of the plurality of logical blocks includes a basic logical operation element, a first storage element, and a second storage element,
      wherein the basic logical operation element receives a first data signal and a first validity indication signal that becomes an asserted state when the first data signal is valid, outputs a second data signal generated by a first logical operation based on the first data signal and a second validity indication signal that becomes an asserted state when the second data signal is valid, and sets the second data signal to the asserted state in response to the asserted state of the first validity indication signal,
   wherein the first storage element holds the second validity indication signal in response to the asserted state of the second validity indication signal, and
   wherein the second storage element holds the second data signal in response to the asserted state of the second validity indication signal.

16. The logical operation system according to claim 15, wherein the logical circuit device selectively loads, from the storage element, information corresponding to the first logical operation or information corresponding to second logical operation in response to the asserted state of the second validity indication signal.

17. The logical operation system according to claim 15, further comprising:
a device that supplies data to the logical circuit device or receives data from the logical circuit device,
   wherein the device operates in accordance with the clock signal.

* * * * *